(12) United States Patent
Cowan et al.

(10) Patent No.: US 6,512,391 B2
(45) Date of Patent: Jan. 28, 2003

(54) PROBE STATION THERMAL CHUCK WITH SHIELDING FOR CAPACITIVE CURRENT

(75) Inventors: Clarence E. Cowan, Newberg, OR (US); Paul A. Tervo, Vancouver, WA (US); John L. Dunklee, Tigard, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

(21) Appl. No.: 10/179,771

(22) Filed: Jun. 24, 2002

(65) Prior Publication Data

US 2002/0167329 A1 Nov. 14, 2002

Related U.S. Application Data

(63) Continuation of application No. 09/345,571, filed on Jun. 30, 1999, now Pat. No. 6,445,202.

(51) Int. Cl.[7] .................. G01R 31/02; G01R 27/28; G01R 31/26
(52) U.S. Cl. .................. 324/760; 324/627; 324/765
(58) Field of Search .................. 324/760, 627, 324/765, 758, 755, 658, 158.1

(56) References Cited

U.S. PATENT DOCUMENTS

| | | |
|---|---|---|
| 5,101,149 A | 3/1992 | Adams et al. |
| 5,266,889 A | 11/1993 | Martin et al. |
| 5,345,170 A | 9/1994 | Schwindt et al. |
| 5,457,398 A | 10/1995 | Schwindt et al. |
| 5,550,482 A | 8/1996 | Sano |
| 5,610,529 A | 3/1997 | Schwindt |
| 5,663,653 A | 9/1997 | Schwindt et al. |
| 6,424,141 B1 * | 7/2002 | Hollman et al. ......... 324/158.1 |

FOREIGN PATENT DOCUMENTS

| | | |
|---|---|---|
| DE | 196 16 212 A1 | 10/1996 |
| DE | 693 22 206 T2 | 11/1998 |
| EP | 0 573 183 B1 | 12/1993 |

* cited by examiner

Primary Examiner—Christine Oda
Assistant Examiner—Anjan K. Deb
(74) Attorney, Agent, or Firm—Chernoff, Vilhauer, McClung & Stenzel, LLP

(57) ABSTRACT

To reduce noise in measurements obtained by probing a device supported on surface of a thermal chuck in a probe station, a conductive member is arranged to intercept current coupling the thermal unit of the chuck to the surface supporting the device. The conductive member is capacitively coupled to the thermal unit but free of direct electrical connection thereto.

8 Claims, 5 Drawing Sheets

PROBE STATION THERMAL CHUCK WITH SHIELDING FOR CAPACITIVE CURRENT

CROSS REFERENCE TO RELATED APPLICATIONS

This is a continuation of application Ser. No. 09/345,571, filed Jun. 30, 1999, now U.S. Pat. No. 6,445,202 B1.

BACKGROUND OF THE INVENTION

The present invention is directed to probe stations suitable for making low current and low voltage measurements and, more particularly, to a system for reducing noise due to capacitive currents resulting from the operation of a thermal chuck for a probe station.

Integrated circuit devices are typically manufactured in and on a wafer of semiconductor material using well-known techniques. Prior to cutting the individual integrated circuit devices from a wafer, tests are run on individual devices to determine if the devices operate properly. The wafer is supported on a chuck inside an environmental enclosure in a probe station. Probes are brought into contact with test points or pads on the integrated circuit devices and a series of measurements are preformed. Schwindt et al., U.S. Pat. No. 5,663,653, disclose an example of a probe station in which the present invention might be used and the patent is incorporated herein by reference.

Many integrated circuit devices are designed to operate at temperatures other than room temperature. To accommodate device testing at temperatures other than the ambient temperature, a thermal chuck may be employed. One design of a thermal chuck comprises a multilayered chuck for securing a wafer having a thermal driver to modify the temperature of the chuck. A thermal chuck of this design is disclosed by Schwindt in U.S. Pat. No. 5,610,529 which is incorporated herein by reference.

The thermal driver may provide for either heating, cooling, or heating and cooling of the chuck. To modify the temperature of the chuck, the thermal driver may comprise one or more thermal units including a thermal device and a plurality of power conductors connecting the thermal device to a power source. Thermal devices, typically electric resistance heaters or thermoelectric heat pumps, are provided to heat the chuck to temperatures above the ambient temperature. The thermoelectric heat pump, also known as a Peltier device, is reversible and can be used for cooling as well as heating the chuck. The thermoelectric heat pump comprises a number of thermocouples sandwiched between two electrically insulating, thermally conductive plates. When DC power is supplied to the thermocouples, the Peltier effect causes heat to be transferred from one plate to the other. The direction of heat flow is reversible by reversing the direction of current flow in the thermocouples. Exposing the chuck to the warmer plate or the cooler plate of the thermoelectric heat pump will, respectively, either heat or cool the chuck. For testing at temperatures below ambient, the thermal chuck may also include passages for circulating coolant to cool the chuck directly or remove excess heat from the thermoelectric heat pump.

When making the low voltage and low current measurements common to testing integrated circuit devices, even very low levels of electrical noise are unsatisfactory. Thermal chucks include several sources of noise and unacceptably high levels of noise are a common problem when using a thermal chuck. One known source of noise is the result of expansion or contraction of the components of the thermal chuck due to changing temperature. Expansion or contraction changes the spacing between conductive components resulting in the generation of capacitive currents which can reach the conductive surface of the chuck. Expansion or contraction due to temperature change can also cause relative transverse movement between the multiple material layers of the chuck. Relative movement between contacting layers of insulating and conductive materials can generate triboelectric current. In a probe station chuck, the triboelectric current can appear as noise in the test measurements. Triboelectric currents can be reduced by a chuck design which prevents movement between contacting layers of insulating and conducting materials.

The operation of the thermal units by the thermal driver controller is another potential source of noise when using a thermal chuck. To change or maintain the temperature of the thermal chuck, the thermal driver controller fluctuates the electrical power to the thermal units in response to a temperature control system. As a result of the voltage drop within the conductors of the thermal units, physically adjacent portions of the electrical conductors leading to and from, and internal to the thermal devices, will be at different potentials. As the power fluctuates, the difference in voltage between the power conductors changes with time. This results in a displacement of charges in the dielectric material surrounding the conductors which manifests itself as a displacement or capacitive current coupled to the conductive top surface of the chuck. This capacitive current appears as noise in the test measurements.

The currently accepted technique to reduce the effects of capacitive currents involves shielding the chuck from external electromagnetic sources. However, the shielding layers of conductive material in the chuck have proven unsuccessful in eliminating the noise from the thermal driver. To reduce noise due to capacitive currents originating in the thermal chuck, users of probe stations often shut off the thermal units and wait for the current to dissipate. However, the RC time constant involved can be greater than five seconds. Waiting a period of five time constants (e.g. 25 seconds) for the observed noise to dissipate to an acceptable level before making a measurement substantially effects the productivity of the probe station.

What is desired, therefore, is a system for reducing the electrical noise generated by the operation of the thermal unit of a probe station's thermal chuck. Reducing noise generated by the thermal chuck reduces the time for the noise to dissipate to acceptable levels improving the productivity of the probe station.

DETAILED DESCRIPTION OF THE PREFERRED EMBODIMENT

Figure 1:
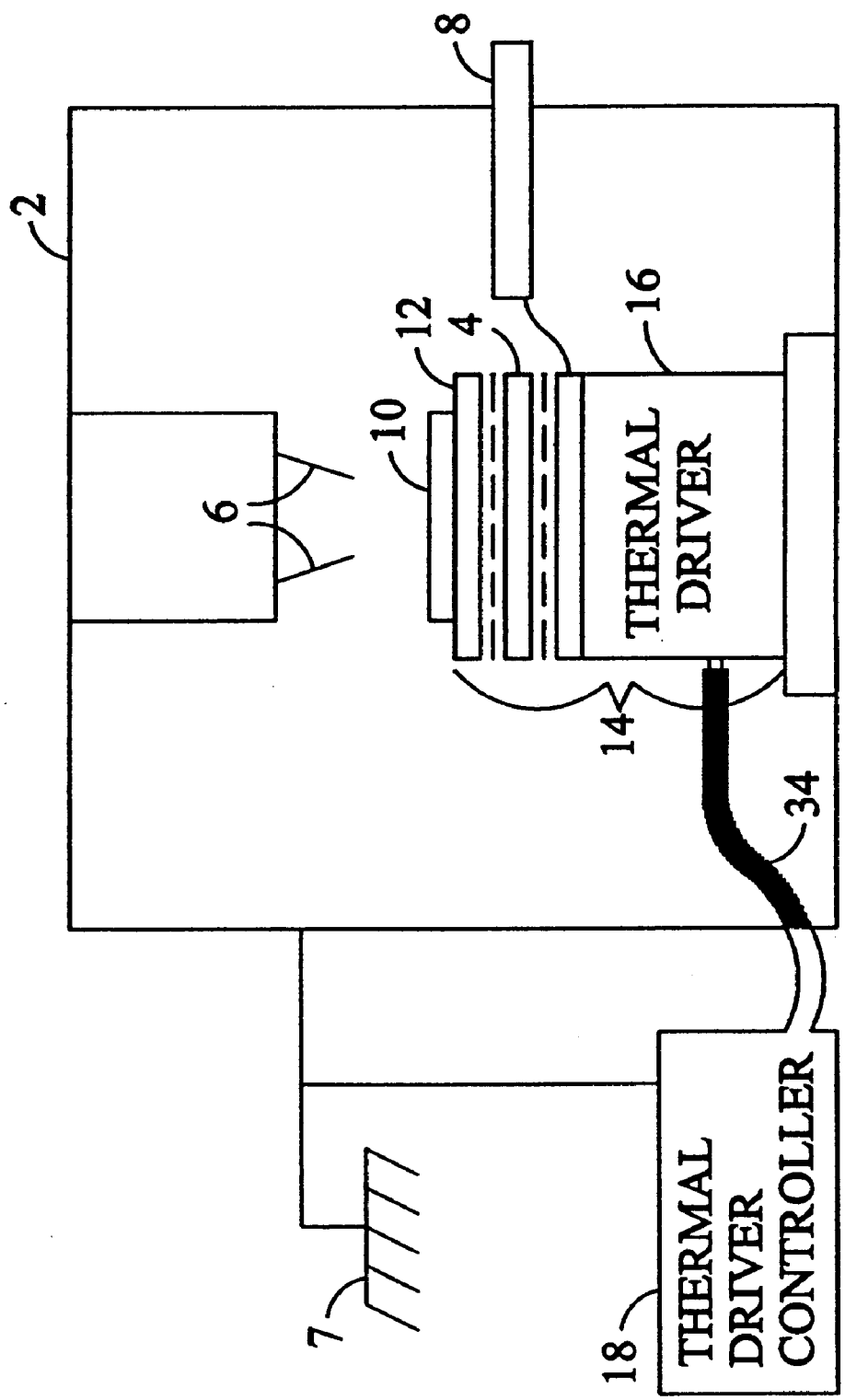
FIG. 1 is a cross-section of a probe station incorporating a thermal chuck.

As illustrated in FIG. 1, a probe station generally includes an environmental enclosure 2 in which is located a chuck 4 and one or more probes 6. The environmental enclosure 2 is typically constructed of a conductive material and grounded 7 so that the chamber, interior to the enclosure 2, is shielded from electromagnetic fields emanating from outside of the enclosure 2. The chuck 4 typically comprises multiple layers of conductive and dielectric materials that are connected to the various conductors of a coaxial or triaxial cable 8. The chuck 4 includes a securement technique for securing a device under test 10, generally a wafer of semiconductor material, to the upper surface 12 of the chuck 4. The upper surface 12 of the chuck 4 is typically conductive. One technique for securing a device under test 10 relies on a vacuum source (not shown) located outside of the environmental enclosure. The vacuum source communicates through appropriate control valves and piping with apertures (not shown) in the upper surface 12 of the chuck 4. When the device under test 10 is placed on the chuck 4 the device blocks apertures leading to the vacuum source. Air pressure holds the device under test 10 against the chuck's upper surface 12. One or more probes 6 can be positioned over the device under test 10 and brought into contact with test pads on the circuit to be tested. Instrumentation connected to the probes 6 measures selected operating parameters of the circuit at the test pads.

Figure 2:
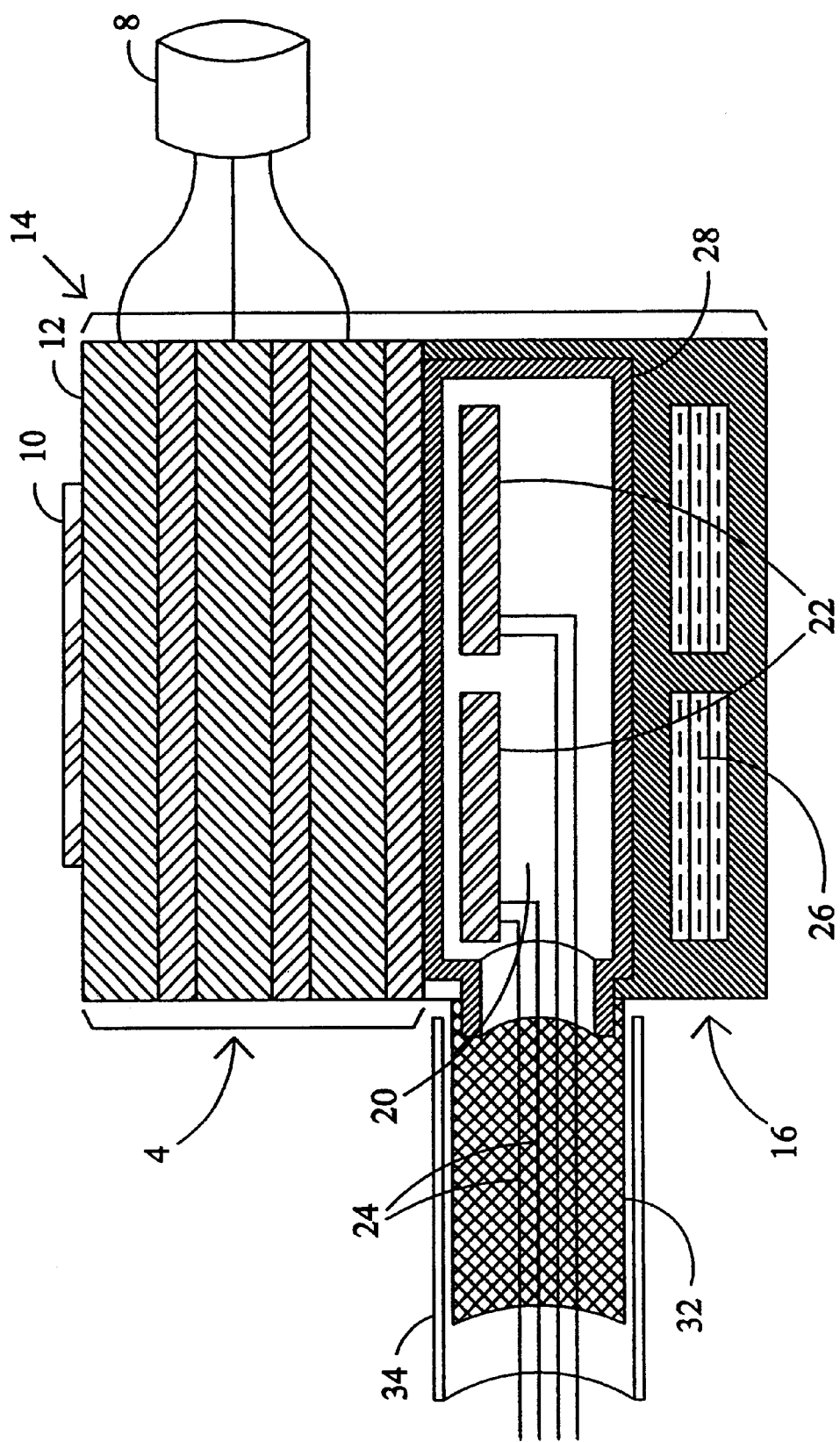
FIG. 2 is a cross section of an exemplary thermal chuck constructed in accordance with the present invention.

A thermal chuck 14, bracketed, may be used to test the operation of devices at temperatures other than the ambient temperature of the environmental enclosure 2. Referring to FIG. 2, the thermal chuck 14, indicated with a bracket, may include a thermal driver 16 having facilities for modifying the temperature of a chuck 4, indicated with a bracket, supported on the top of the thermal driver 16. The thermal driver 16 may be arranged to provide for either heating, cooling, or heating and cooling of the chuck 4. The thermal driver 16 comprises one or more electrically powered thermal units 20 each of which includes one or more thermal devices 22 and a plurality of insulated power conductors 24 connecting the thermal devices 22 to a thermal driver controller 18. Typically, the thermal devices 22 are resistance heaters or thermoelectric heat pumps. Resistance heaters and thermoelectric heat pumps can increase the temperature of the chuck 4. The thermoelectric heat pump can also be used to cool the chuck 4. The thermoelectric heat pump, also known as a Peltier device, comprises a plurality of electrically connected thermocouples of p-type and n-type semiconductor materials sandwiched between two plates of an electrically insulating, thermally conducting material. When DC power is supplied to the thermocouples, heat is transferred from one plate to the other as a result of the Peltier effect. The direction of heat flow is reversible by reversing the direction of current flow in the semiconductors. Exposing the chuck 4 to the warmer plate or the cooler plate of the thermoelectric heat pump will, respectively, heat or cool the chuck 4.

The thermal driver 16 may also include passages 26 for circulating coolant supplied by a coolant source (not shown) typically located outside of the environmental enclosure 2. For testing at temperatures below the ambient temperature, the chuck 4 may be cooled directly by the coolant. If a thermoelectric heat pump is used to cool the chuck, circulating coolant may be necessary to remove heat transferred to the thermal driver 16 by the heat pump.

Electric power for the thermal units 20 is supplied by the thermal driver controller 18 located outside of the environmental enclosure 2. Insulated power conductors 24 transfer the electrical power to the thermal devices 22 in the thermal chuck 14. In response to a temperature sensing system, the thermal driver controller 18 fluctuates the electrical power to the thermal unit 20 to vary its thermal output to either reduce or increase the rate of addition or removal of thermal energy to or from the chuck 4. As a result of the voltage drop in the thermal unit 20, adjacent portions of the insulated power conductors 24 and the conductors inside the thermal devices 22 are at differing potentials. This causes a displacement of charge in the dielectric material surrounding the conductors. As the thermal driver controller 18 fluctuates the power to the thermal unit 20 the difference in voltage between adjacent conductors also varies with time. The present inventors came to the realization that this displacement of charge varying with time causes a displacement or capacitive current which is coupled to the conductive upper surface 12 of the chuck 4. The present inventors further realized that this capacitive current manifests itself as noise in the test measurements.

Figure 3:
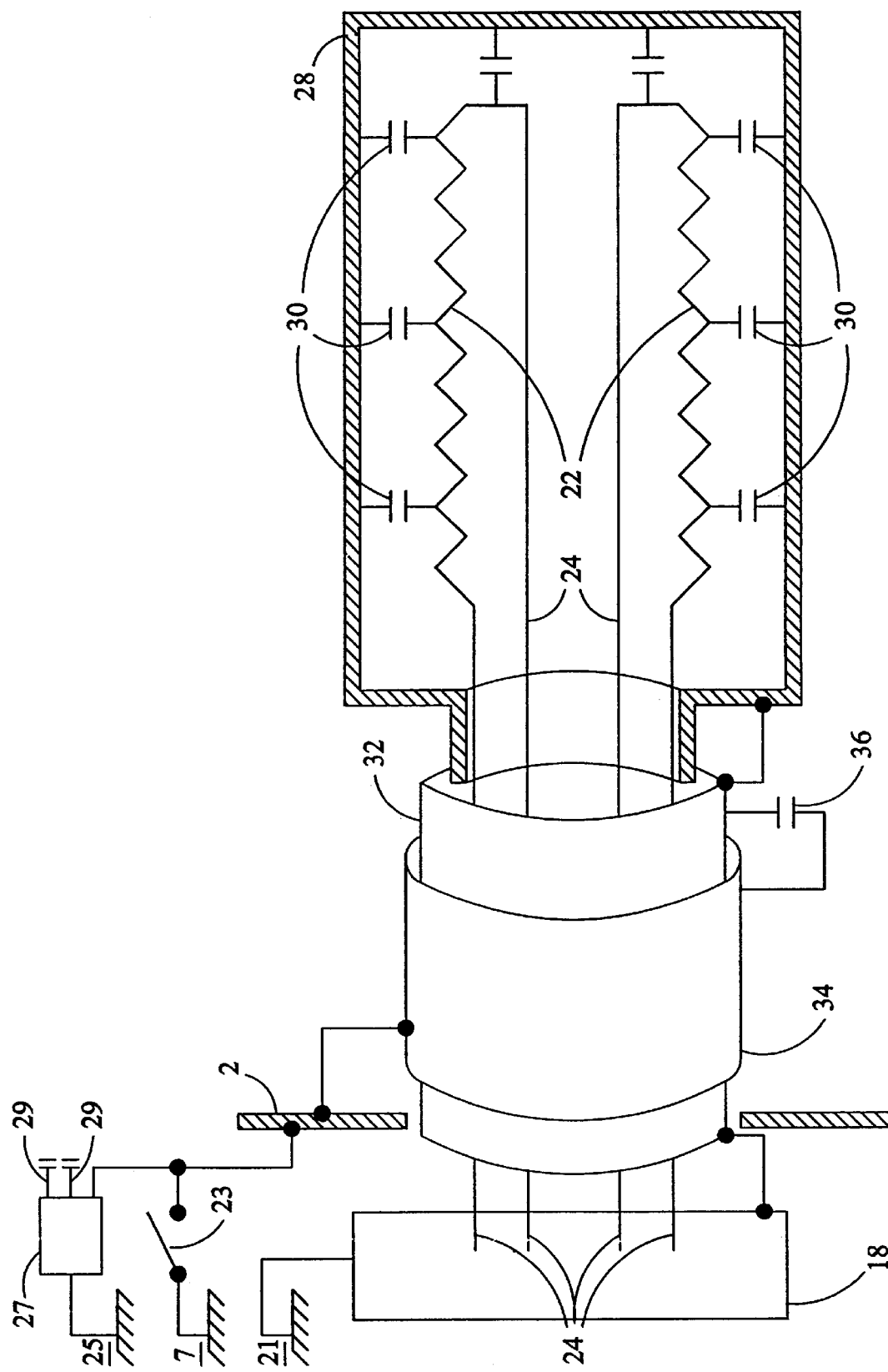
FIG. 3 is an exemplary schematic diagram of a thermal unit and shielding in accordance with a first aspect of a preferred embodiment of the present invention.

The present inventors came to the realization that the aforementioned capacitive currents are a significant source of noise when making measurements in the femtoamp range with state of the art probe stations. The present inventors further realized that conductive shielding of the thermal unit 20 that is capacitively coupled to the conductors of the thermal unit 20 can intercept a substantial amount, and preferably substantially all, of the capacitive currents resulting from the operation of the thermal unit 20 and provide a conductive path to return any current induced in the conductive shielding to the thermal driver controller 18 and to ground. This is in contrast to the presently accepted techniques of adding more shielding to the chuck itself. Referring also to FIG. 3, a conductive thermal device shell 28 substantially encloses the thermal devices 22 and the power conductors 24 at their connection to the thermal devices 22. Variation in charge displacement resulting from the operation of the electric circuit of the thermal device 22 results in a displacement current in the conductive thermal device shell 28. In other words, the thermal device shell 28 is capacitively coupled through "virtual" coupling capacitors 30 to the electric circuit of the thermal device 22 and intercepts capacitive currents that would otherwise find their way to the upper surface 12 of the chuck 4. Although apertures may be required in the thermal device shell 28 they should be minimized in relation to the total surface area of the thermal device shell 28. The more completely the thermal device shell 28 spatially encloses the thermal device 22 the more completely it will intercept capacitive currents emanating from the thermal device 22. The thermal device shell 28 is conductively connected to the thermal driver controller 18 through the conductive shield of the cable 32. The conductive connection of the thermal device shell 28 to the thermal driver controller 18 provides a path for any current in the thermal device shell 28 to exit the environmental enclosure 2 to the thermal driver controller 18. The driver controller 18 is connected to ground 7 extending the conductive return path for capacitive currents to ground 7.

The present inventors also came to the stark realization that by enclosing the thermal devices 22 with a conductive shell 28 the RC time constant of the thermal chuck is dramatically reduced. The thermal devices 22 do not need to be turned off in order for the noise to be sufficiently reduced. The present inventors determined that this reduction in RC time constant is due to a reduction in the stored capacitive charge in the dielectric material within the chuck, referred to as absorption capacitance. The absorption capacitance of a material includes a series resistance so, in effect, it has a memory of previous charges and is slow to dissipate. This absorption capacitance was not previously considered in the design of thermal chucks. There was little, if any, motivation to enclose the thermal devices 22 in a conductive enclosure, as it was believed that noise from the thermal devices 22 could be removed by layers of shielding in the chuck 4. The layers of the chuck 4 include, however, dielectric material which the inventor realized is, in fact, a source of the long RC time constant.

The cable 32 includes the power conductors 24 connecting the thermal driver controller 18 to the thermal devices 22. The shield of the cable 32 ideally extends through the wall of the environmental enclosure 2 and encompasses the power conductors 24 at their entrance into the thermal device shell 28. The shield of the cable 32 is capacitively coupled to the power conductors 24 and will intercept and return to the thermal driver controller 18 currents emanating from the capacitive effects of power fluctuation in the power conductors 24. The thermal driver controller 18 is grounded at ground connection 21. The more complete the enclosure of all conductors in the thermal unit 20 by the conductive shielding, the more complete will be the protection of the test measurement from noise generated by the operation of the thermal unit 20.

The walls of the environmental enclosure 2 are typically conductive material. The conductive material shields the chamber inside the environmental enclosure 2 from electromagnetic (EM) fields originating outside of the enclosure 2 which would otherwise result in noise within the probe 6. The environmental enclosure 2 is grounded to return to ground the currents generated in the conductive wall by the EM fields. In a preferred embodiment of the present invention, the conductive wall of the environmental enclosure is extended to substantially surround parts of the thermal units. The extension of the wall of the enclosure provides a conductive shield capacitively coupled to the thermal units which can return capacitive currents to the enclosure ground.

Referring to FIG. 3, in a first aspect of this preferred embodiment the wall of the environmental enclosure 2 is extended coaxially with yet another shield layer 34 of the cable 32 to a point of close physical proximity to the thermal device shell 28 yet being free from direct electrical connection to the shield of the cable 32, the thermal driver controller 18, and the thermal device shell 28. The wall of the environmental enclosure 2 is extended proximate to the thermal device shell 28 by connecting the outer shield layer 34 of the cable 32 to the wall of the environmental enclosure 2. The cable 32 includes the power conductors 24 connecting the thermal driver controller 18 to the thermal devices 22. Capacitive currents emanating from the power conductors 24 are intercepted by the shield of cable 32 and returned to the thermal driver controller 18 and the thermal driver controller ground 21. The extension of the wall of the environmental enclosure 2 through the outer shield 34 of the power cable 32 is capacitively coupled to the shield of the cable 32 by a "virtual" capacitor 36 and intercepts capacitive currents leaking from within the cable 32 which might otherwise couple to the chuck 4. Any current in the extension of the environmental enclosure 2 is returned to ground 7 outside of the environmental enclosure 2 if switch 23 is closed. If the switch 23 is open, capacitive currents are returned to the ground 25 of an instrument 27 which is connected by leads 29 to probes inside the chamber.

Figure 4:
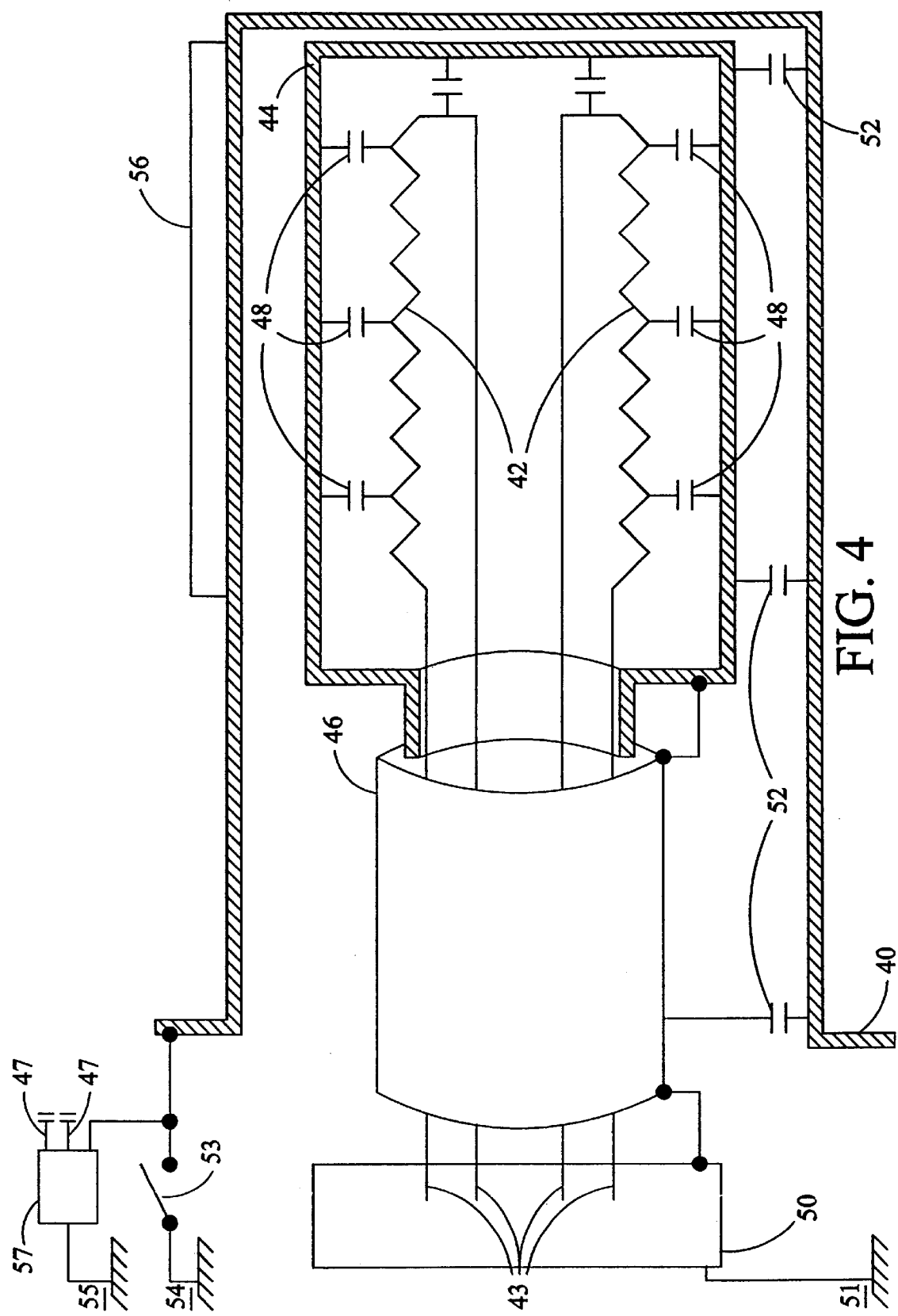
FIG. 4 is an exemplary schematic diagram of a thermal unit and shielding in accordance with a second aspect of a preferred embodiment of the present invention.

Referring to FIG. 4, in a second aspect of this preferred embodiment the wall of the environmental enclosure 40 is extended to substantially surround the thermal devices 42, the thermal device shell 44 and the power cable 46 connecting the thermal devices 42 to the thermal driver controller 50. Heat is transferred to and from the chuck 56 through the thermal device shell 44 and the wall of the environmental enclosure 40. The thermal devices 42 are capacitively coupled to the thermal shell 44 by virtual capacitors 48. The thermal device shell 44 and the shield of the power cable 46 are, in turn, capacitively coupled to the wall of the environmental enclosure 40 by virtual coupling capacitors 52. Capacitive currents in the thermal device shell 44 or the shield of the cable 46 are returned to the thermal driver controller 50 through the conductive shield layer of the cable 46. The thermal driver controller 50 is connected to the thermal devices 42 by power conductors 43 and to ground at ground 51. Capacitive currents leaking from the thermal device shell 44 or the power cable 46 will be intercepted by the wall of the enclosure 40 and returned to the enclosure ground 54 when the switch 53 is closed. When the switch 53 is open, capacitive currents in the wall of the environmental enclosure 40 are returned to the ground 55 of instrument 57. The instrument 57 is connected to the probes 6 inside the environmental enclosure by instrument leads 47.

Figure 5:
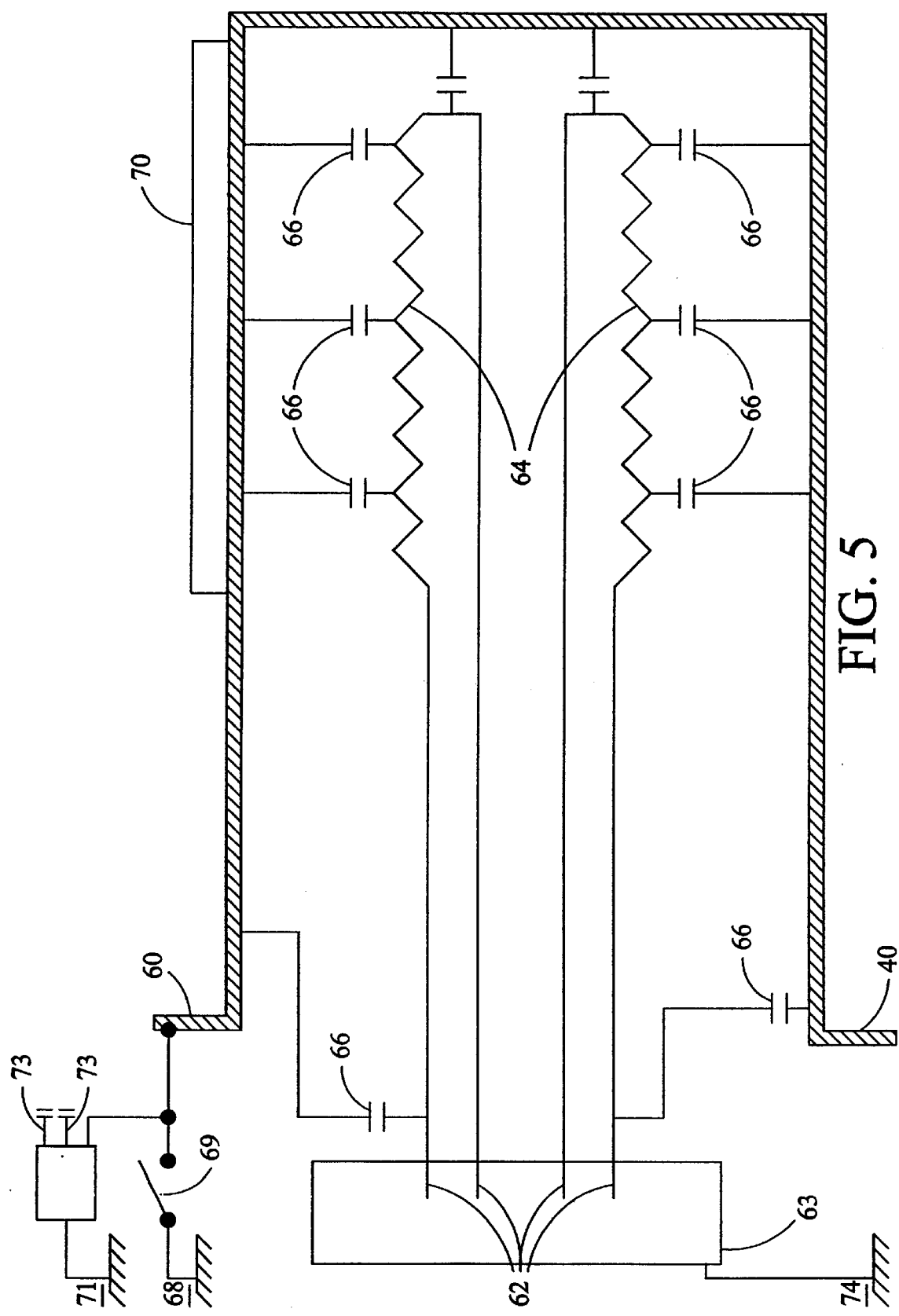
FIG. 5 is an exemplary schematic diagram of a thermal unit and shielding in accordance with a third aspect of a preferred embodiment of the present invention.

Referring to FIG. 5, in a third aspect of this preferred embodiment the wall of the environmental enclosure 60 is extended to surround the thermal devices 64 and the power conductors 62 connecting the thermal devices 64 to the thermal driver controller 63. The thermal driver controller is grounded at ground 74. In this aspect of the invention, the thermal devices 64 and the power conductors 62 are capacitively coupled to the wall of the environmental enclosure 60 through the virtual coupling capacitors 66. Capacitive currents generated in the thermal devices 64 or power cables 62 are intercepted by the shield formed by the conductive wall of the enclosure 60 and returned to the enclosure ground 68 when the switch 69 is closed. If the switch 69 is open the walls of the enclosure 60 are grounded through the instrument 73 to the instrument ground 71. Heat is transferred to and from the chuck 70 through the wall of the environmental enclosure 60.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

What is claimed is:

1. A method of reducing measurement noise during probe testing of a device under test supported on a surface of a chuck, said chuck including a thermal unit for modifying a temperature of said device under test, said method comprising the steps of:

(a) arranging a conductive member to intercept a current coupling said thermal unit to said surface of said chuck, said conductive member being capacitively coupled to said thermal unit while free of direct electrical connection thereto; and (b) conductively connecting said conductive member to a controller supplying power to said thermal unit.

2. The method of claim 1 wherein the step of arranging a conductive member to intercept a current coupling said thermal unit to said surface of said chuck comprises the step of substantially enclosing said thermal unit in a conductor, said conductor including a surface interposed between said thermal unit and said surface of said chuck.

3. The method of claim 1 further comprising the step of grounding said conductive member proximate to said controller.

4. A method of reducing measurement noise during probe testing of a device under test supported on a surface of a chuck, said chuck including a thermal unit for modifying a temperature of said device under test, said method comprising the steps of:

(a) arranging a first conductive member to intercept a current coupling said thermal unit to said surface of said chuck, said first conductive member being capacitively coupled to said thermal unit while free of direct electrical connection thereto;

(b) arranging a second conductive member substantially encircling a major length of a power conductor connecting said thermal unit and a controller supplying power to said thermal unit; and (c) conductively connecting said first and said second conductive members to said controller.

5. The method of claim 4 wherein the step of arranging a first conductive member to intercept a current coupling said thermal unit to said surface of said chuck comprises the step of substantially enclosing said thermal unit in a conductor, said conductor including a surface interposed between said thermal unit and said surface of said chuck.

6. The method of claim 4 further comprising the step of grounding said first and said second conductive members proximate to said controller.

7. A method of reducing measurement noise when probe testing a device under test supported on a surface of a chuck, said chuck including a thermal unit for modifying a temperature of said device under test, said method comprising the steps of:

(a) substantially enclosing said thermal unit and a conductor of power to said thermal unit in a conductive enclosure, said conductive enclosure including a surface interposed between said surface of said chuck and said thermal unit and interposed between said surface of said chuck and a substantial length of said conductor; and (b) conductively connecting said conductive member to a controller supplying power to said thermal unit.

8. The method of claim 7 further comprising the step of grounding said conductive member proximate to said controller.

* * * * *